(12) United States Patent
Kim et al.

(10) Patent No.: US 6,947,336 B2
(45) Date of Patent: *Sep. 20, 2005

(54) SEMICONDUCTOR DEVICE WITH IMPEDANCE CONTROL CIRCUIT

(75) Inventors: Tae-Hyoung Kim, Seongnam-shi (KR); Uk-Rae Cho, Suwon-shi (KR); Nam-Seog Kim, Seoul (KR)

(73) Assignee: Samsung Electronics, Co., Ltd., Suwon (KR)

( * ) Notice: Subject to any disclaimer, the term of this patent is extended or adjusted under 35 U.S.C. 154(b) by 168 days.

This patent is subject to a terminal disclaimer.

(21) Appl. No.: 10/410,453

(22) Filed: Apr. 8, 2003

(65) Prior Publication Data

US 2003/0218914 A1 Nov. 27, 2003

(30) Foreign Application Priority Data

May 22, 2002 (KR) .................. 10-2002-0028481

(51) Int. Cl.[7] .............................................. G11C 16/04
(52) U.S. Cl. ............................ 365/189.05; 365/189.07; 365/189.08
(58) Field of Search ....................... 365/189.05, 189.07, 365/189.11, 189.08

(56) References Cited

U.S. PATENT DOCUMENTS 6,307,791 B1  10/2001  Otsuka et al.
6,573,746 B2 *  6/2003  Kim et al. ................... 326/30
2003/0231523 A1 * 12/2003  Cho et al. ............. 365/189.05

FOREIGN PATENT DOCUMENTS

JP        2000183717        6/2000

* cited by examiner

Primary Examiner—Anh Phung
Assistant Examiner—Hien Nguyen
(74) Attorney, Agent, or Firm—F. Chau & Associates, LLC

(57) ABSTRACT

A semiconductor device includes an output impedance control circuit, connected to a ZQ pad and an output buffer circuit, for controlling an impedance of the output buffer circuit according to an impedance of an external resistor connected with the ZQ pad.

20 Claims, 15 Drawing Sheets

SEMICONDUCTOR DEVICE WITH IMPEDANCE CONTROL CIRCUIT

BACKGROUND OF THE INVENTION

1. Field of the Invention

The present invention relates to semiconductor devices, and more particularly to a semiconductor device that includes an output impedance controller for controlling impedance of an output buffer according to an impedance value of an external resistor.

2. Discussion of Related Art

Many electronic products, for example, personal computers and workstations, include various semiconductor devices such as microcomputers, memories, and gate arrays. The semiconductor devices typically include input/output pins and an output circuit for data transmission with other devices. The output circuit has, for example, output buffers and drivers. The input/output pins of the semiconductor device are connected to corresponding transmission lines such as wires formed on a board. Internal data of a semiconductor device is provided to another semiconductor device through transmission lines that form an interface. For data output from a semiconductor device, the data is transmitted over the transmission lines, and for there to be proper transmission, impedance between the input/output pins and the transmission lines needs to be matched.

As operational speeds of electronic products increase, the signal swing transmitted through an interface decreases. This allows a delay time to be minimized at signal transmission. However, as the signal swing width of a transmitted signal decreases, external noise increases. External noise can affect the reflection characteristics output signal if there is impedance mismatch at an interface. Impedance mismatch is caused by external noise or by power supply voltage, temperature and process variations. If impedance mismatch arises, a transmission speed of the data decreases, and the data from a semiconductor device is distorted. Thus, in a case where a semiconductor device receives distorted data, problems can be caused by setup/hold failures or errors in reading received data.

Impedance correcting techniques for matching impedance are used for semiconductor memory devices with other devices. For example, in case of an HSTL (high speed transceiver logic) interface, a technique exists for controlling impedance so as to have a desired output impedance value within several tens of ohms using one additional pin. In case of a semiconductor device adopting the impedance correcting techniques of semiconductor memory devices, however, it is difficult to obtain output impedance equal to a designed value because of variations in power supply voltage, temperature, and processing.

To overcome aforementioned problems, generally, a trimming circuit having a metal, bonding, or fuse operation is provided in a semiconductor device. Impedance matching is accomplished by adjusting a reference voltage for impedance matching and a resistance value range using the trimming circuit. This technique is called a programmable impedance control function. However, the programmable impedance control function technique needs a considerable amount of test time and an additional process for adjusting impedance. As a result, fabrication costs can increase.

Accordingly, a need exists for a system and method that can obtain a desired output impedance value irrespective of power supply voltage, temperature, and process variations to match impedance.

SUMMARY OF THE INVENTION

It is therefore an object of the invention to provide a semiconductor device with an impedance control circuit capable of automatically obtaining a desired output impedance value irrespective of power supply voltage, temperature, and process variations.

It is another object of the invention to provide a semiconductor device that includes a scaled-down impedance control circuit.

In accordance with an embodiment of the present invention, there is provided to a semiconductor device that includes an output buffer circuit having a pull-up section of pull-up transistors and a pull-down section of pull-down transistors; a pad connected with an external resistor; and an output impedance control circuit that is connected to the pad and the output buffer circuit and controls an impedance of the output buffer circuit according to an impedance of the external resistor. A first transistor is connected to the pad. A first current source circuit supplies DC current to the pad, and a first level controller is connected to the pad and controls a gate voltage of the first transistor such that the pad is established at a predetermined voltage. A second transistor is connected to a first internal node and is controlled by the first level controller. A first variable impedance circuit is connected to the first internal node, and a second current source circuit supplies DC current to the first internal node. A first controller, responsive to a voltage variation of the first internal node, generates a first control code for controlling the first variable impedance circuit so that a voltage of the first internal node is established at the predetermined voltage. A first conversion circuit receives the first control code and converts the control code into a string of data bits. The data bits of the string are transferred in series to the output buffer circuit via a single transmission line.

The impedance control circuit further comprises a third transistor that is connected to a second internal node and is controlled by the first level controller; a third current source circuit that supplies DC current to the second internal node; a fourth transistor that is connected to the second internal node; a second level controller that is connected to the second internal node and controls a gate voltage of the fourth transistor such that the second internal node is established at the predetermined voltage; a first discharge circuit that discharges DC current from the second internal node; a fifth transistor that is connected to a third internal node and is controlled by the second level controller; a second discharge circuit that discharges DC current from the third internal node; a second variable impedance circuit that is connected to the third internal node; a second controller, responsive to a voltage variation of the third internal node, which generates a second control code for controlling the second variable impedance circuit so that a voltage of the third internal node is established at the predetermined voltage; a second conversion circuit that receives the second control code and converts the control code into a string of data bits; and a selector that selects the first and second conversion circuits in turns. A string of data bits from a selected conversion circuit are transferred in series to the output buffer circuit via the single transmission line, so that transistors of each of the pull-up and pull-down sections are selectively turned-on by the string of data bits.

In a preferred embodiment, the predetermined voltage is half a power supply voltage that is an operating voltage of the output buffer circuit. Each of the first to third current source circuits includes a PMOS transistor whose gate is grounded, and each of the first and second discharge circuits includes an NMOS transistor whose gate is connected to the power supply voltage.

In the semiconductor device, the output impedance control circuit further comprises a clock generator for generating first to fourth clock signals, the first to third clock signals having the same period and the fourth clock signal having a period shorter than that of the third clock signal.

In addition, a driving capacity of each of the first to third current source circuits is adjusted by a current controller. In that case, the current controller compares voltages of the pad and internal node with a reference voltage and generates first control signals and second control signals. A driving capacity of each of the first and second discharge circuits is adjusted by the current controller. Each of the first to third current source circuits includes a plurality of PMOS transistors controlled by the first control signals, and each of the first and second discharge circuits includes a plurality of NMOS transistors controlled by the second control signals.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

The preferred embodiment of the invention will be more fully described with reference to the attached drawings.

Figure 1:
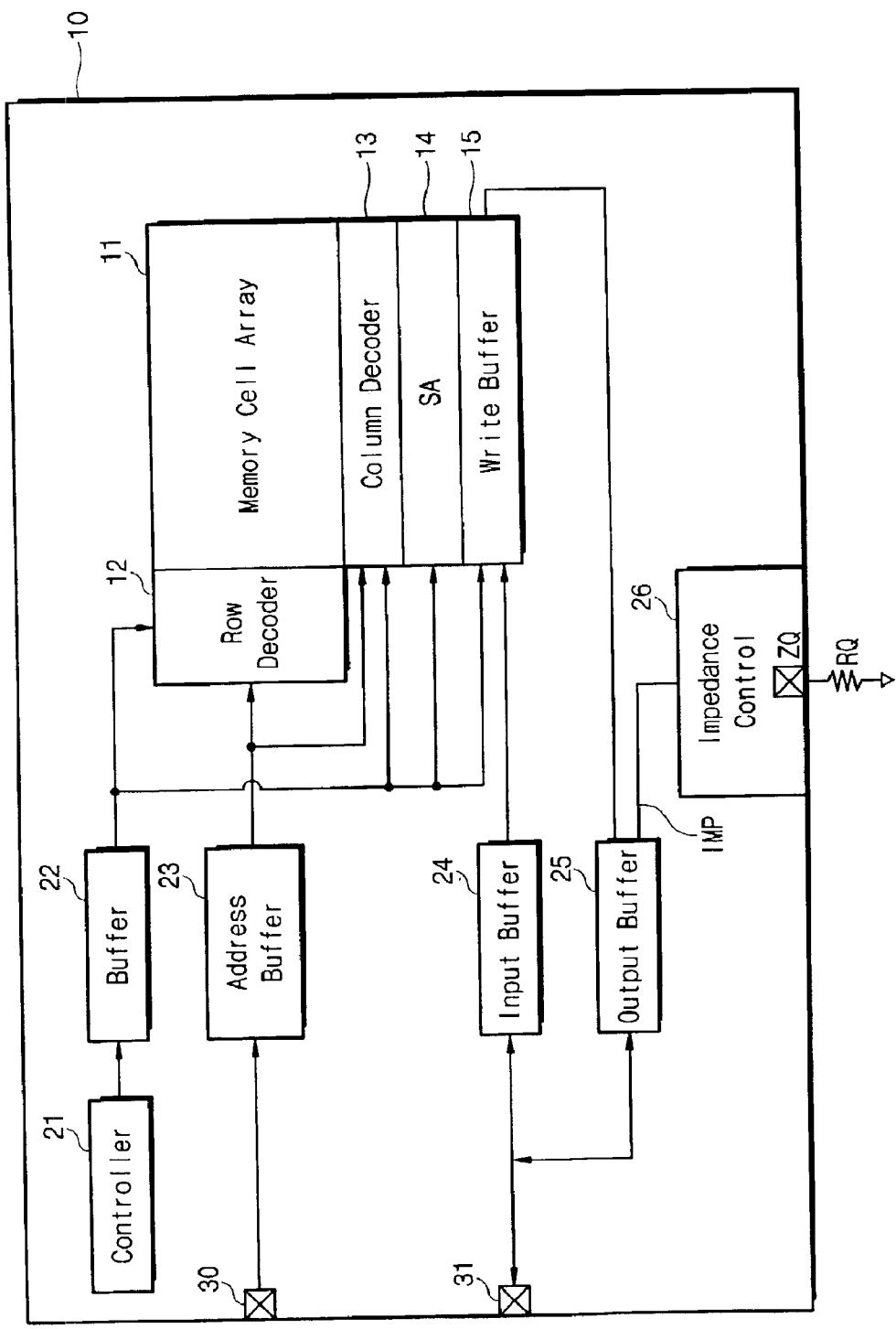
FIG. 1 is a schematic diagram of a semiconductor device according to an embodiment of the present invention.

FIG. 1 shows a semiconductor device according to the present invention. Referring to FIG. 1, a semiconductor device according to the present invention will be explained using a semiconductor memory device as an example. The semiconductor memory device 10 can be a random access memory such as SRAM or DRAM, or a read only memory such as a FLASH memory or a ferroelectric memory.

The semiconductor memory device 10 is a memory chip and includes a memory cell array 11, a row decoder circuit 12, a column decoder circuit 13, a sense amplifier circuit 14, a write buffer circuit 15, a read/write control circuit 21, a buffer circuit 22, an address buffer circuit 23, and an input buffer circuit 24, which are well known to those skilled in the art. Thus, a description thereof will be omitted for brevity's sake. The control circuit 21 generates timing control signals for a read/write operation, which are provided to the circuits 12 to 15 through the buffer circuit 22.

Referring again to FIG. 1, the semiconductor memory device 10 further includes an output buffer circuit 25 connected to a pad or terminal 31 and an output impedance control circuit 26 connected to a pad or terminal ZQ. The output buffer circuit 25 outputs internally read-out data through the pad or terminal 31, and the output impedance control circuit 26 detects an impedance of an external resistor RQ connected to the pad ZQ and automatically controls an impedance of the output buffer circuit 25 according to a detection result. The control circuit 26 internally generates pull-up and pull-down control codes having a parallel format and outputs pull-up and pull-down control codes having a serial format. For example, if each control code is 5 bit data, 5 data bits of the pull-up/pull-down control code are transmitted in series from the control circuit 26 to the output buffer circuit 25, and then 5 data bits of the pull-down/pull-up control code are transmitted in series from the control circuit 26 to the output buffer circuit 25. This means that only one signal or transmission line IMP is used for transmitting the pull-up and pull-down control codes.

The external resistor RQ indicates an impedance value of a transmission line that is connected to the semiconductor memory device 10. The driving capacity of the output buffer circuit 25 can be adjusted by making the impedance of the output buffer circuit 25 equal to the impedance defined by the external resistor RQ. The output buffer circuit 25 and the output impedance control circuit 26 constitute an output circuit of a programmable impedance structure that allows for the aforementioned programmable impedance control function.

Figure 2:
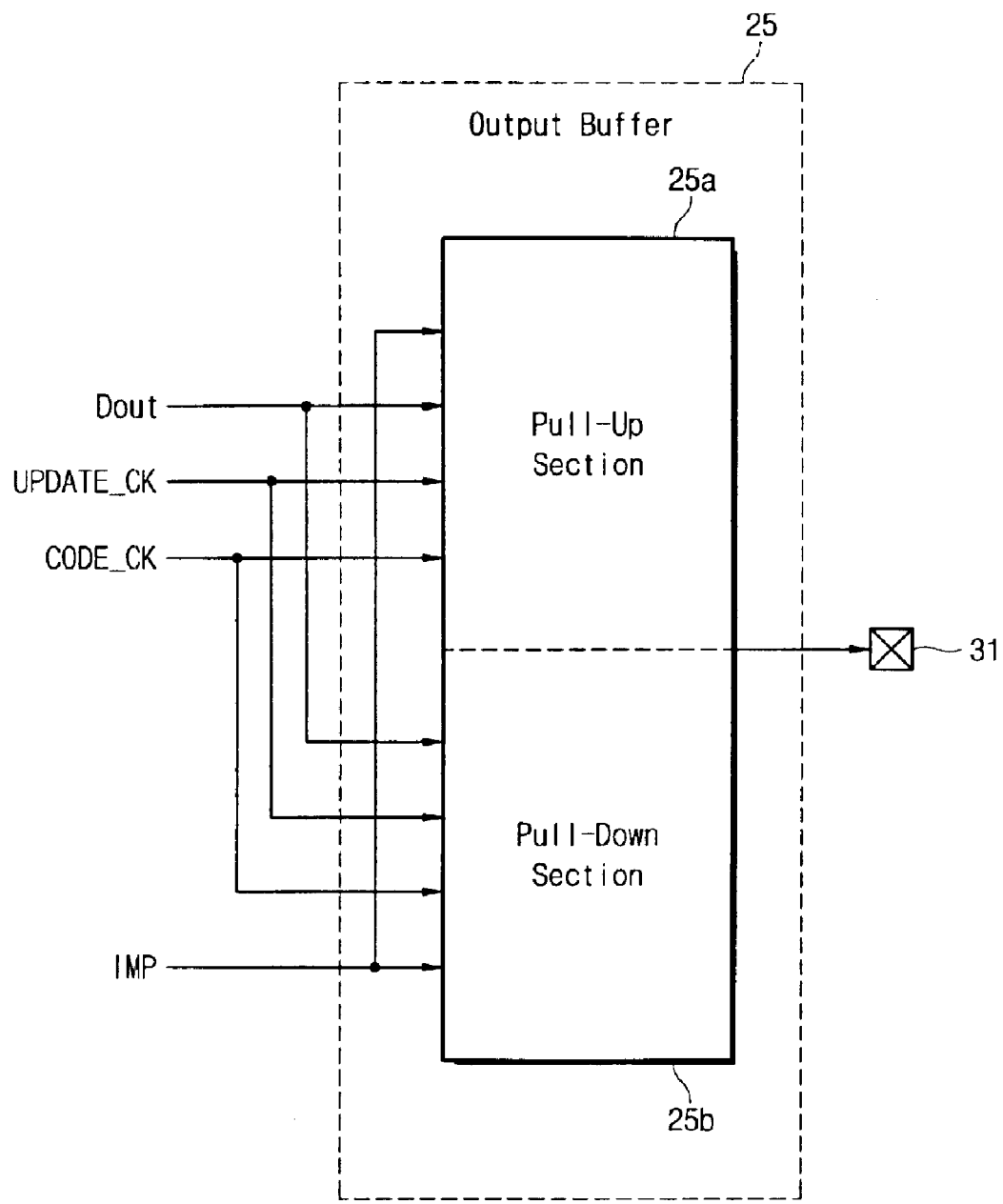
FIG. 2 is a schematic diagram of an output buffer circuit in FIG. 1.

FIG. 2 is a schematic diagram of the output buffer circuit 25 in FIG. 1. Referring to FIG. 2, the output buffer circuit 25 is connected to a pad 31 and includes a pull-up section 25a and a pull-down section 25b. Although not shown in the figures, the pull-up section 25a comprises a plurality of PMOS transistors that are connected in parallel to the pad 31, and the pull-down section 25b comprises a plurality of NMOS transistors that are connected in parallel to the pad 31. The pull-up and pull-down sections 25a and 25b selectively drive the pad 31 in response to data to be output. The driving capacity or impedance of each section will be determined by pull-up and pull-down control codes from the output impedance control circuit 26 in FIG. 1. As described above, the pull-up and pull-down control codes are transmitted in series via only one signal line IMP.

The pull-up and pull-down control codes are provided to corresponding sections 25a and 25b by a serial transmission. For example, the pull-up control code is provided to the pull-up section 25a in synchronism with a clock signal CODE_CK during the first logic period (e.g., a low period) of a clock signal UPDATE_CK. The pull-down control code is provided to the pull-down section 25b in synchronism with the clock signal CODE_CK during the second logic period (e.g., a high period) of the clock signal UPDATE_CK. PMOS transistors of the pull-up section 25a are selectively turned-on according to the provided code value, and NMOS transistors of the pull-down section 25b are selectively turned-on according to the provided code value. As code values from the control circuit 26 are changed, the driving capacity or impedance of the pull-up and pull-down sections 25a and 25b can be adjusted.

Figure 3:
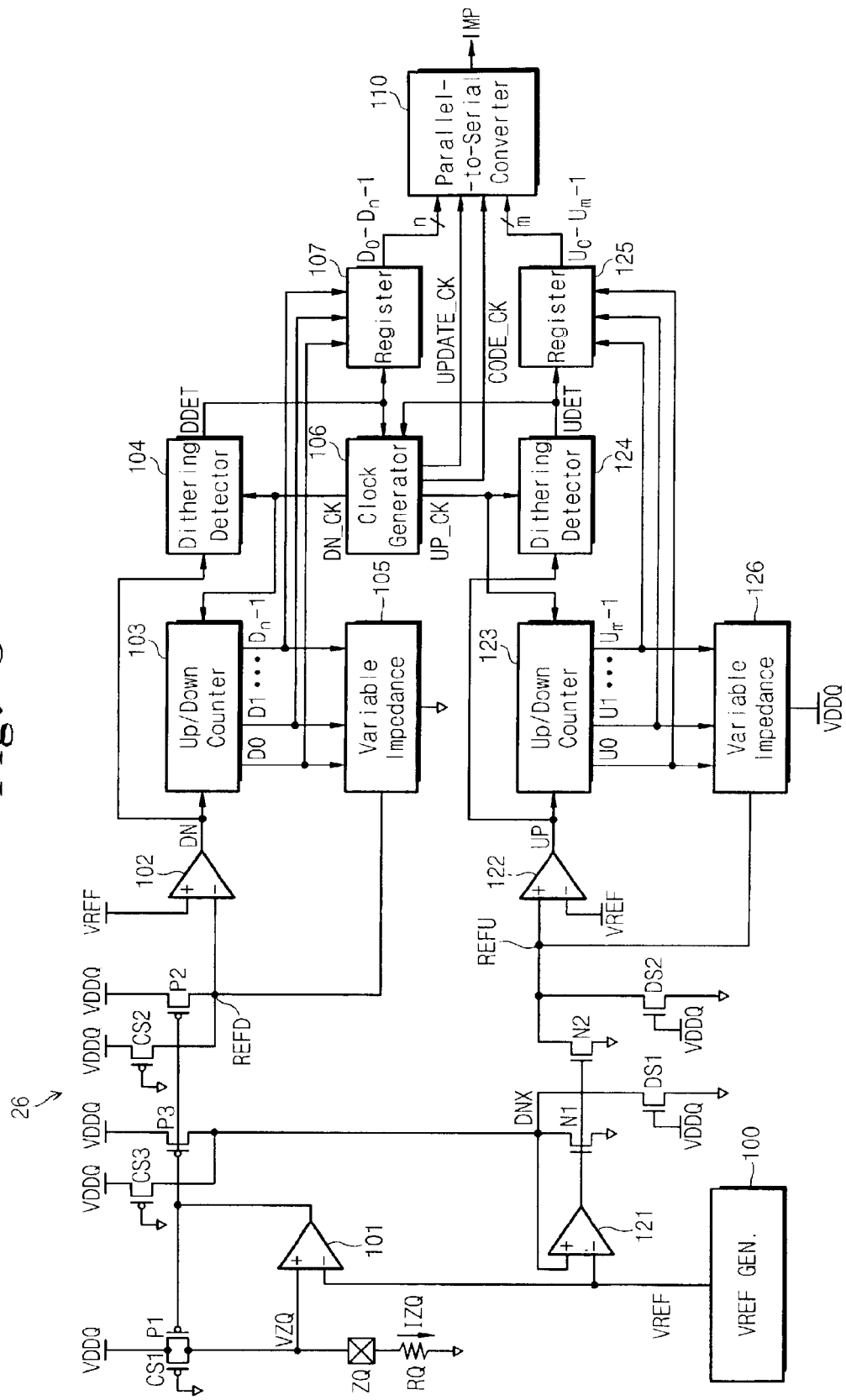
FIG. 3 shows an output impedance control circuit according to a preferred embodiment of the present invention.

FIG. 3 shows an output impedance control circuit according to a preferred embodiment of the present invention. Referring to FIG. 3, the output impedance control circuit 26 is connected to the pad or terminal ZQ that is coupled with the external resistor RQ. A reference voltage generator 100 is supplied with a power supply voltage VDDQ used as an operating voltage of an output buffer circuit 25 and generates a reference voltage VREF. The reference voltage VREF is a half of the power supply voltage VDDQ, or VDDQ/2. The reference voltage VREF is supplied to an inverting input terminal of an operational amplifier 101. A non-inverting input terminal of the amplifier 101 is connected to the ZQ pad. A PMOS transistor PI is connected between the power supply voltage VDDQ and the ZQ pad, and is controlled by an output voltage of the amplifier 101. A PMOS transistor CS1, whose gate is grounded, is connected in parallel with the PMOS transistor P1.

When a voltage VZQ of the ZQ pad is higher than the reference voltage VREF, the output voltage of the amplifier 101 increases, and the amount of current flowing through the transistor PI decreases. Thus, a voltage VZQ of the ZQ pad decreases. If a voltage VZQ of the ZQ pad is lower than the reference voltage VREF, the output voltage of the amplifier 101 decreases, and the amount of current flowing via the transistor PI increases. Thus, a voltage VZQ of the ZQ pad increases. A voltage VZQ of the ZQ pad becomes equal to the reference voltage VREF (VDDQ/2) by repeating the aforementioned operations. That is, a gate voltage of the transistor PI is controlled such that a voltage VZQ of the ZQ pad becomes VDDQ/2.

A PMOS transistor P2 is connected between the power supply voltage VDDQ and an internal node REFD, and is controlled by the output voltage of the amplifier 101. A PMOS transistor CS2 whose gate is grounded is connected in parallel with the PMOS transistor P2. A PMOS transistor P3 is connected between the power supply voltage VDDQ and an internal node DNX and is controlled by the output voltage of the amplifier 101. A PMOS transistor CS3 whose gate is grounded is connected between the power supply voltage VDDQ and the node DNX.

Herein, the PMOS transistors CS1, CS2, and CS3 act as constant current sources. DC current is supplied to the ZQ pad and the nodes REFD and DNX via the PMOS transistors CS1, CS2, and CS3.

Since the PMOS transistor P2 is controlled by the output voltage of the amplifier 101 and forms a current mirror together with the PMOS transistor PI, the same amount of current flows via the transistors P1 and P2. Current supplied to the ZQ pad flows via the external resistor RQ. Current flowing via the resistor RQ is marked by "IZQ". The current IZQ is a reference current indicating a resistance value of the resistor RQ. Accordingly, the PMOS transistor P2 supplies current from the power supply voltage to a variable impedance circuit 105 according to the reference current IZQ. Likewise, the PMOS transistor P3 supplies current from the power supply voltage to the node DNX according to the reference current IZQ.

Referring again to FIG. 3, an operational amplifier 121 has an inverting input terminal supplied with the reference voltage VREF and a non-inverting input terminal connected to the node DNX. An NMOS transistor N1, whose gate is connected to an output voltage of the amplifier 121, is connected between the node DNX and a ground voltage. An NMOS transistor N2 has its gate connected to receive the output voltage of the amplifier 121 and its current path formed between an internal node REFU and the ground voltage. An NMOS transistor DS1, whose gate is connected to the power supply voltage VDDQ, has its current path formed between the node DNX and the ground voltage. An NMOS transistor DS2, whose gate is connected to the power supply voltage VDDQ, has its current path formed between the node REFU and the ground voltage.

With this configuration, a constant amount of current is discharged to the ground voltage from the node REFU, that is, from a variable impedance circuit 126, via the transistors N2 and DS2. While DC current is discharged via the transistor DS2, a variable amount of current is discharged via the transistor N2. As a result, the amount of current determined according to a value of the resistor RQ is supplied to the nodes REFD and DNX via the transistors P2, P3, CS2, and CS3. Likewise, the amount of current flowing from the node REFU to the ground voltage is equal to the amount of current supplied to the node DNX.

Since PMOS transistors CS1 to CS3, for supplying DC current, are formed in parallel with PMOS transistors P1 to P3, respectively, the sizes of the transistors P1 to P3 can be scaled down as compared with those when the transistors CS1 to CS3 are not used. The reason is because the amount of current to be supplied via each transistor P1 to P3 is separated. Likewise, since NMOS transistors DS1 and DS2 for discharging DC current are formed in parallel with NMOS transistors N1 and N2, respectively, the sizes of the transistors N1 and N2 can be scaled down as compared with those when the transistors DS1 and DS2 are not used. The reason is because the amount of current to be discharged via each of the transistor N1 and N2 is separated.

Continuing to referring to FIG. 3, the output impedance control circuit 26 further comprises a comparator 102, an up/down counter 103, a dithering detector 104, a clock generator 106, and a register 107.

The comparator 102 has its inverting input terminal connected to the node REFD and its non-inverting input terminal connected to receive the reference voltage VREF. The comparator 102 compares the REFD voltage with the reference voltage VREF to output a detection signal DN. The clock generator 106 generates four clock signals DN_CK, UP_CK, UPDATE_CK, and CODE_CK. The clock signals DN_CK, UP_CK, and UPDATE_CK have the same period, and the clock signal CODE_CK has a period at least five times shorter than that of the clock signal UPDATE_CK. For example, the clock signals DN_CK, UP_CK, and UPDATE_CK are obtained by 64-dividing a system clock signal.

The up/down counter 103 operates in synchronism with the clock signal DN_CK from the clock generator 106. The counter 103 performs a count-up/down operation in response to the detection signal DN and outputs data bits D0–Dn–1 as a control code. The variable impedance circuit 105 has a plurality of NMOS transistors connected in parallel with the node REFD, which will be more fully described below. The transistors of the variable impedance circuit 105 are selectively turned-on according to the control code D0–Dn–1. A voltage of the node REFD will have a voltage VDDQ/2 through a feedback loop that comprises the comparator 102, the counter 103, and the variable impedance circuit 105. The dithering detector 104 receives an output signal DN of the comparator 102 and detects whether a voltage of the node REFD swings within a predetermined amplitude range. When the output signal DN has a high level and a low level in turn, that is, when a voltage of the node REFD swings within the amplitude range, the detection signal DDET is activated high. When the signal DDET is activated, the register 107 receives and stores data bits D0–Dn–1 from the up/down counter 103 as a control code. The driving capacity or impedance of a pull-down section 25b is adjusted according to the data bits D0–Dn–1.

The output impedance control circuit 26 further comprises a comparator 122, an up/down counter 123, a dithering detector 124, and a register 125.

The comparator 122 has its inverting input terminal connected to the node REFU and its non-inverting input terminal connected to receive the reference voltage VREF. The comparator 122 compares the REFU voltage with the reference voltage VREF to output a detection signal UP. The up/down counter 123 operates in synchronism with the clock signal UP_CK from the clock generator 106. The counter 123 performs a count-up/down operation in response to the detection signal UP and outputs data bits U0–Um–1 as a control code. The variable impedance circuit 126 has a plurality of PMOS transistors connected in parallel with the node REFU, which will be more fully described below. The transistors of the variable impedance circuit 126 are selectively turned-on according to the control code U0–Um–1. A voltage of the node REFU will have a voltage VDDQ/2 through a feedback loop comprising the comparator 122, the counter 123, and the variable impedance circuit 126. The dithering detector 124 receives an output signal UP of the comparator 122 and detects whether a voltage of the node REFU swings within a predetermined amplitude range. When the output signal UP has a high level and a low level in turn, that is, when a voltage of the node REFU swings within the amplitude range, the detection signal UDET is activated high. When the signal UDET is activated, the register 125 receives and stores data bits U0–Um–1 from the up/down counter 123. The driving capacity or impedance of a pull-up section 25a is adjusted according to the data bits U0–Um–1.

The clock generator 106 changes a period of the clock signal DN_CK when the detection signal DDET is activated. The period of the clock signal DN_CK, for example, becomes two times longer when the detection signal DDET is activated. Likewise, the clock generator 106 changes a period of the clock signal UP_CK when the detection signal UDET is activated. The period of the clock signal UP_CK, for example, becomes two times longer when the detection signal UDET is activated.

The output impedance control circuit 26 further comprises a parallel-to-serial converter 110. The parallel-to-serial converter 110 receives control codes D0–Dn–1 and U0–Um–1 in response to the clock signals UPDATE_CK and CODE_CK. The parallel-to-serial converter 110 converts a parallel format of each of the control codes into a serial format and outputs converted serial data to the output buffer circuit 25 via a single line IMP.

Figure 4:
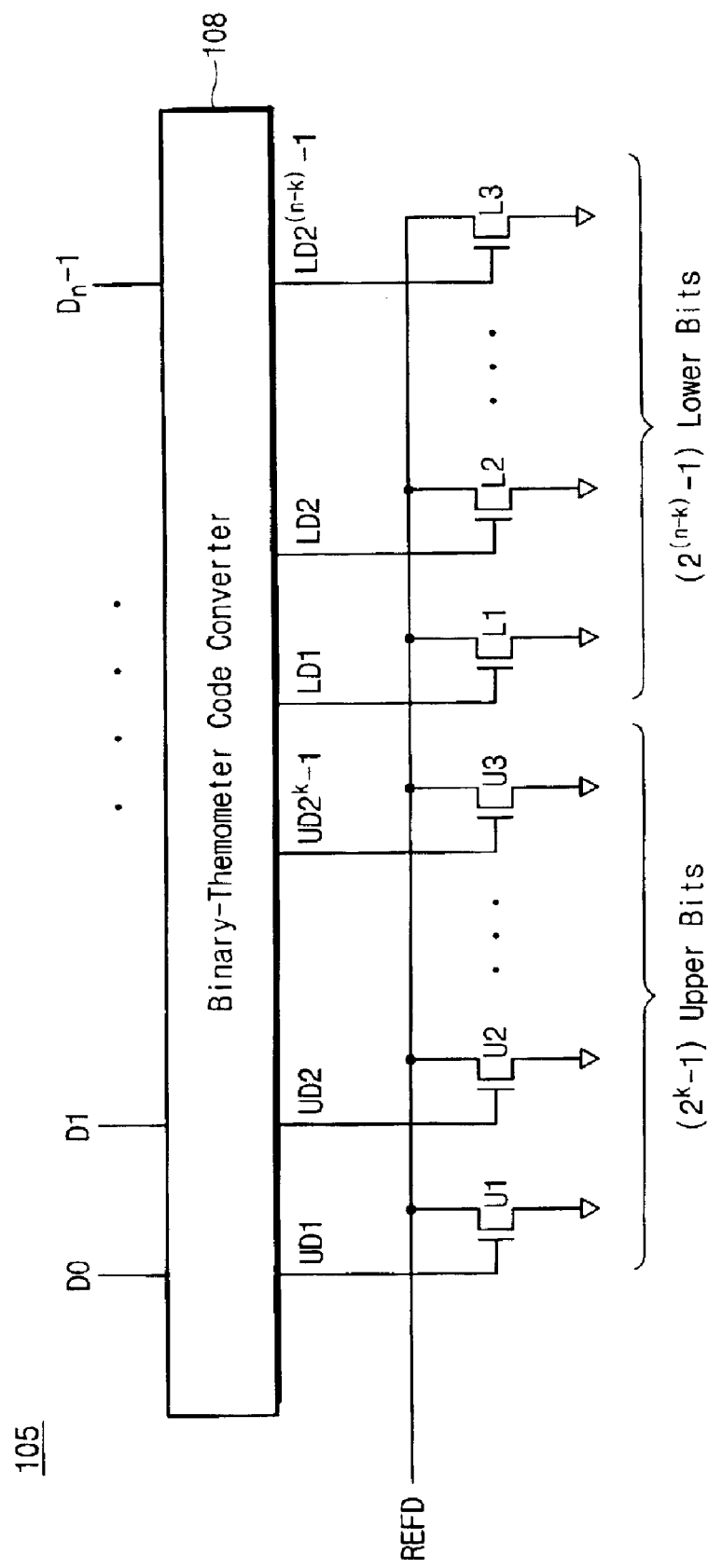
FIG. 4 is a preferred embodiment of a variable impedance circuit illustrated in FIG. 3.

FIG. 4 is a preferred embodiment of a variable impedance circuit illustrated in FIG. 3. Referring to FIG. 4, a variable impedance circuit 105 includes a binary-thermometer code converter 108 and a plurality of NMOS transistors L1–L3 and U1–U3. The code converter 108 converts binary code signals D0–Dn–1 from an up/down counter 103 into separated or segmented thermometer codes LD1–LD$^{(n-k)}$–1 and UD1–UD$2^k$–1. The code converter 108 separates n-bit data D0–Dn–1 from the up/down counter 103 into k upper data bits and (n–k) lower data bits. The separated data bits are converted into $(2^k-1)$ upper thermometer code bits UD1–UD$2^k$–1 and $(2^{(n-k)}-1)$ lower thermometer code bits LD1–LD$2^{(n-k)}$–1. The upper transistors U1–U3 are controlled by the upper thermometer code bits UD1–UD$2^k$–1, respectively, and are connected in parallel between a node REFD and a ground voltage. The lower transistors L1–L3 are controlled by the upper thermometer code bits UD1–UD$2^k$–1, respectively, and are controlled by the lower thermometer code bits LD1–LD$2^{(n-k)}$–1.

It is assumed that data from the up/down counter 103 is 5-bit data. The code converter 108 separates the 5-bit data D0–D4 into three upper data bits and two lower data bits. The code converter 108 converts the three upper data bits into $(2^k-1)$ upper thermometer code and the two lower data bits into $(2^{(n-k)}-1)$ lower thermometer code. That is, the upper thermometer code is 7-bit data and the lower thermometer code is 3-bit data.

A ratio of a size of an upper transistor to that of a lower transistor is $2^{(n-k)}$:1, that is, 4:1. The upper transistors U1–U3 have the same size, and the lower transistors L1–L3 have the same size.

Although not shown in FIG. 4, the binary-thermometer code converter 108 includes an inversion section at its output stage for outputting the signals UD1–UD$2^k$–1 and LD1–LD$2^{(n-k)}$–1. Accordingly, if an output value D0–Dn–1 of the counter 103 increases by one, the number of transistors U1–U3 and L1–L3 turned-on decreases by one. If an output value D0–Dn–1 of the counter 103 decreases by one, the number of transistors, U1–U3 and L1–L3, turned-on increases by one. Alternatively, an inversion section can be provided at an output stage of the counter 103 so as to invert data bits D0–Dn–1.

In a case where the binary code is used in the variable impedance circuit 105, a plurality of transistors in the variable impedance circuit 105 can be turned-on at the same time according to variations in the data bits from the up/down counter 103. For example, when data bits from the up/down counter 103 vary from '10000' to '01111', four transistors are simultaneously turned-on, so that an impedance glitch phenomenon arises. According to an embodiment of the present invention, the impedance glitch phenomenon is avoided by using a segmented thermometer code instead of a thermometer code, wherein the thermometer code needs more transistors than the segmented thermometer code.

Also, in case of converting n-bit data from the up/down counter 103 into a thermometer code, the number of bits converted into the thermometer code becomes $2^n$ bits. The variable impedance circuit 105 of the present invention performs a separated or segmented thermometer code conversion function, so that the number of bits of converted code becomes $(2^k-1)+(2^{(n-k)}-1)$ that is less than $2^n$. When 5-bit data is converted into a thermometer code, a converted thermometer code has $2^5$ bits, that is, 32 bits. Accordingly, the variable impedance circuit 105 needs 32 transistors. In accordance with the present invention adopting a segmented thermometer code conversion, however, the variable impedance circuit 105 needs only 10 transistors. As a result, the variable impedance circuit 105 of the present invention can be realized using fewer transistors and alleviates the impedance glitch phenomenon.

Figure 5:
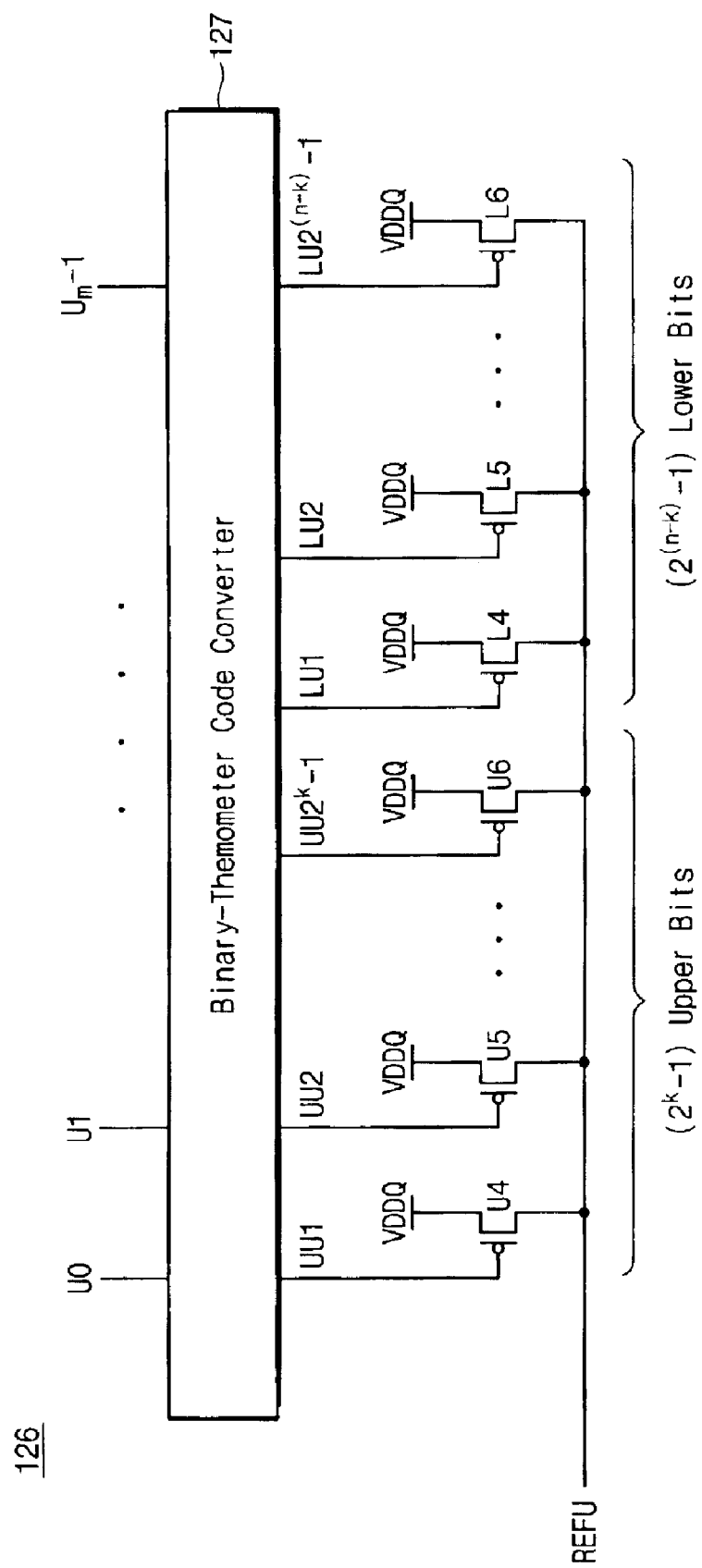
FIG. 5 shows a variable impedance circuit according to a preferred embodiment of the present invention.

FIG. 5 shows a variable impedance circuit 126 according to a preferred embodiment of the present invention. A variable impedance circuit 126 includes a binary-thermometer code converter 127 and a plurality of PMOS transistors. The binary-thermometer code converter 127 in FIG. 5 is substantially similar to FIG. 4, and a description thereof will be omitted for brevity's sake. The PMOS transistors are divided into upper PMOS transistors U4–U6 and lower PMOS transistors L4–L6. The transistors U4–U6 and L4–L6 are connected in parallel between a power supply voltage VDDQ and a node REFU. The upper PMOS transistors U4–U6 are controlled by corresponding upper thermometer code signals UU1–UU2$^k$–1 from the binary-thermometer code converter 127, respectively. The lower PMOS transistors L4–L6 are controlled by corresponding lower thermometer code signals LU1–LU2$^{(n-k)}$–1 from the binary-thermometer code converter 127, respectively.

Figure 6A:
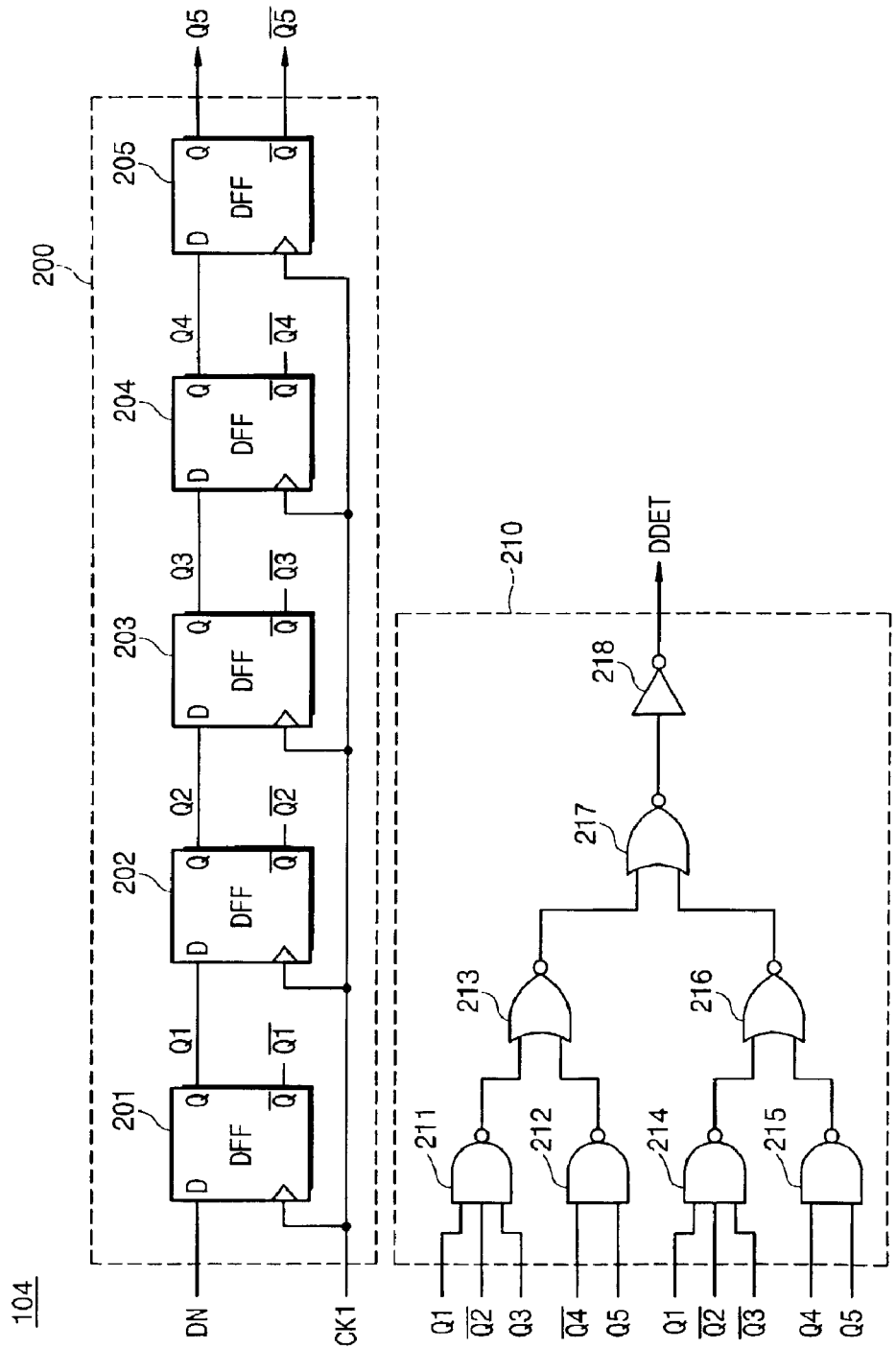
FIG. 6A is a preferred embodiment of a dithering detector in FIG. 3.

FIG. 6A is a preferred embodiment of a dithering detector in FIG. 3. FIG. 6A shows a dithering detector 104 of FIG. 3. Dithering detector 124 is substantially similar to dithering detector 104, thus a description thereof will be omitted for brevity's sake. Referring to FIG. 6A, the dithering detector 104 includes a flip-flop array 200 and a detection signal generator 210. The flip-flop array 200 has a plurality of flip-flops, for example, five D flip-flops 201–205, that operate in synchronism with a clock signal CK1 (DN_CK from FIG. 3) from a clock generator 106. The D flip-flop 201 receives an output signal DN from a comparator 102 in synchronism with the clock signal CK1. The D flip-flops 202–205 receive output signals of previous stages in synchronism with the clock signal CK1, respectively.

The detection signal generator 210 includes NAND gates 211, 212, 214, and 215, NOR gates 213, 216, and 217, and an inverter 218, which are connected as illustrated in FIG. 6A. The detection signal generator 210 generates a detection signal DDET in response to output signals Q1–Q5 and /Q1–/Q5 from the flip-flop array 200. The detection signal DDET indicates that a voltage of the node REFD converges into a predetermined voltage range.

A voltage of a node REFD that is connected with a PMOS transistor P2 and a variable impedance circuit 105 swings within an amplitude on the basis of a reference voltage VDDQ/2, and is not fixed to the reference voltage VDDQ/2. That is, the voltage of the node REFD has the amplitude corresponding to a quantization error on the basis of the reference voltage VDDQ/2. Since the variable impedance circuit 105 operates responsive to data D0–Dn–1 from an up/down counter 103, an impedance value of the circuit 105 has a discrete level value according to a digital impedance code, not a continuous value of an analog form. For example, if an REFD voltage is higher than the reference voltage VREF (VDDQ/2), a detection signal DN from a comparator 102 has a low level, or logic '0'. The up/down counter 103 decreases a count value by one in response to the detection signal DN of the low level. As a count value of the counter 103 is decreased by one, one of transistors L1–L3 and U1–U3 in the variable impedance circuit 103 is turned-on. This means that the REFD voltage becomes lower. On the other hand, if the REFD voltage is lower than the reference voltage VREF (VDDQ/2), the detection signal DN has a high level, or logic '1'. The up/down counter 103 increases a count value by one in response to the detection signal DN of the high level. As a count value of the counter 103 is increased by one, one of transistors L1–L3 and U1–U3 in the variable impedance circuit 103 is turned-off. This means that the REFD voltage becomes higher.

As the above operations are repeated, the detection signal DN from the comparator 102 has a predetermined pattern (e.g., H, L, H, H). When the detection signal DN has a predetermined pattern, a dithering detector 104 activates a detection signal DDET. When the detection signal DDET is activated, data D0–Dn–1 from the up/down counter 103 is stored in a register 107. A parallel-to-serial converter 110 receives the stored data D0–Dn–1 in the register 107 in response to clock signals UPDATE_CK and CODE_CK from a clock generator 106. This will be more fully described hereinafter.

Figure 6B:
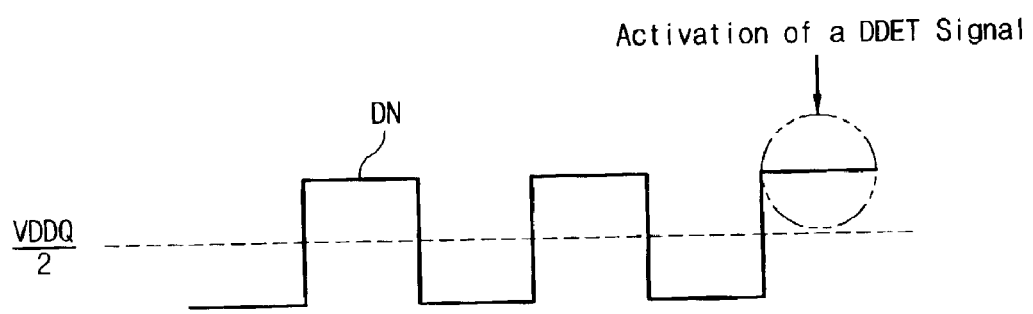
FIGS. 6B and 6C show waveforms of a detection signal DN before a detection signal DDET from a dithering detector is activated, according to an embodiment of the present invention.
Figure 6C:
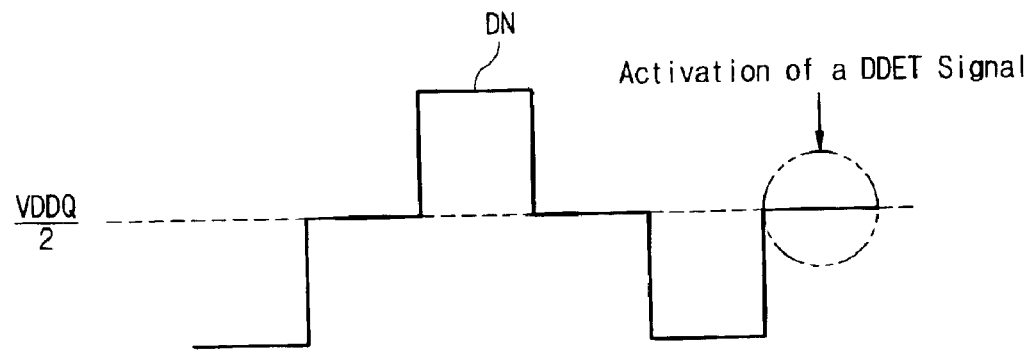

FIGS. 6B and 6C show waveforms of a detection signal DN before a detection signal DDET of a dithering detector is activated. Referring to FIG. 6B, a dithering detector 104 receives an output DN of a comparator 102 and determines whether a voltage of a node REFD converges into a reference voltage VDDQ/2. If a voltage of a node REFD converges into the reference voltage VDDQ/2, the dithering detector 104 activates the detection signal DDET. For example, as illustrated in FIG. 6B, when an output signal DN of the comparator 102 is changed to the order of 1, 0, 1, 0, and 1, the detection signal DDET is activated by gates 211, 212, and 217 and an inverter 218 in the dithering detector 104.

A node REFD can have a three-level voltage owing to a hysterisis characteristic of a comparator 102, as illustrated in FIG. 6C. When a voltage of the node REFD is changed between three voltage levels on the basis of a reference voltage VREF (VDDQ/2), a detection signal DDET is activated by gates 214–217 and an inverter 218 in a dithering detector 104.

A dithering detector 124 in FIG. 3 is configured to be substantially similar to a dithering detector 104 in FIG. 6A, and description thereof will be omitted for brevity's sake. The dithering detector 124 receives an output signal UP of a comparator 122 and determines whether a voltage of the node REFU converges into the reference voltage VREF (VDDQ/2). When a voltage of a node REFU converges into the reference voltage VREF (VDDQ/2), the dithering detector 124 activates a detection signal UDET. When the detection signal UDET is activated, data U0–Um–1 from an up/down counter 123 is stored in a register 125.

An external resistor RQ of a system on which a semiconductor device is mounted has a fixed value. Therefore, if data D0–Dn–1 corresponding to an impedance value of the resistor RQ is stored in the register 107, that is, if a detection signal DDET from a dithering detector 104 is activated, a clock generator 106 makes a frequency (or period) of a clock signal DN_CK, supplied to a counter 103 and a dithering detector 104, become lower (or longer). Likewise, if a detection signal UDET from a dithering detector 124 is activated, the clock generator 106 makes a frequency (or period) of a clock signal UP_CK, supplied to a counter 123 and a dithering detector 124, become lower (or longer). Accordingly, after an impedance value of the resistor RQ is detected, power consumption can be reduced.

Figure 7:
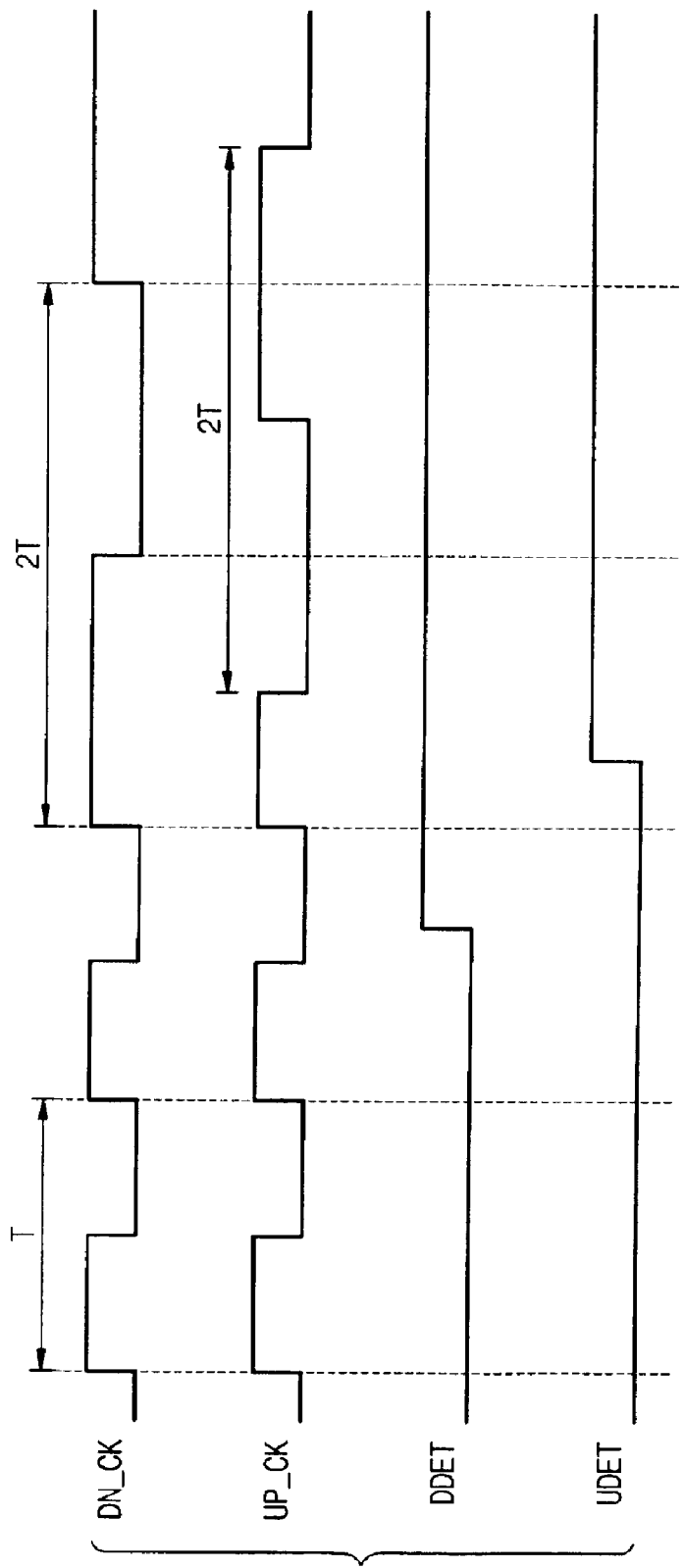
FIG. 7 shows a relationship between clock signals DN_CK and UP_CK from a clock generator and detection signals DDET and UDET from dithering detectors, according to an embodiment of the present invention.

FIG. 7 shows a relationship between clock signals DN_CK and UP_CK, and detection signals DDET and UDET. For example, it is assumed that a clock generator 106 divides a system clock signal into 64 cycles to generate clock signals DN_CK and UP_CK. The clock signal DN_CK is supplied to an up/down counter 103 and a dithering detector 104, and the clock signal UP_CK is supplied to an up/down counter 123 and a dithering detector 124. If a detection signal DDET is activated, the clock generator 106 divides the system clock signal into 128 cycles to generate the clock signal DN_CK. That is, as illustrated in FIG. 7, a period 2T of the clock signal DN_CK after the detection signal DDET is activated is two times longer than T before the detection signal DDET is activated. Likewise, if a detection signal UDET is activated, the clock generator 106 divides the system clock signal into 128 cycles to generate the clock signal UP_CK. That is, as illustrated in FIG. 7, a period 2T of the clock signal UP_CK after the detection signal UDET is activated is two times longer than T before the detection signal UDET is activated.

Figure 8:
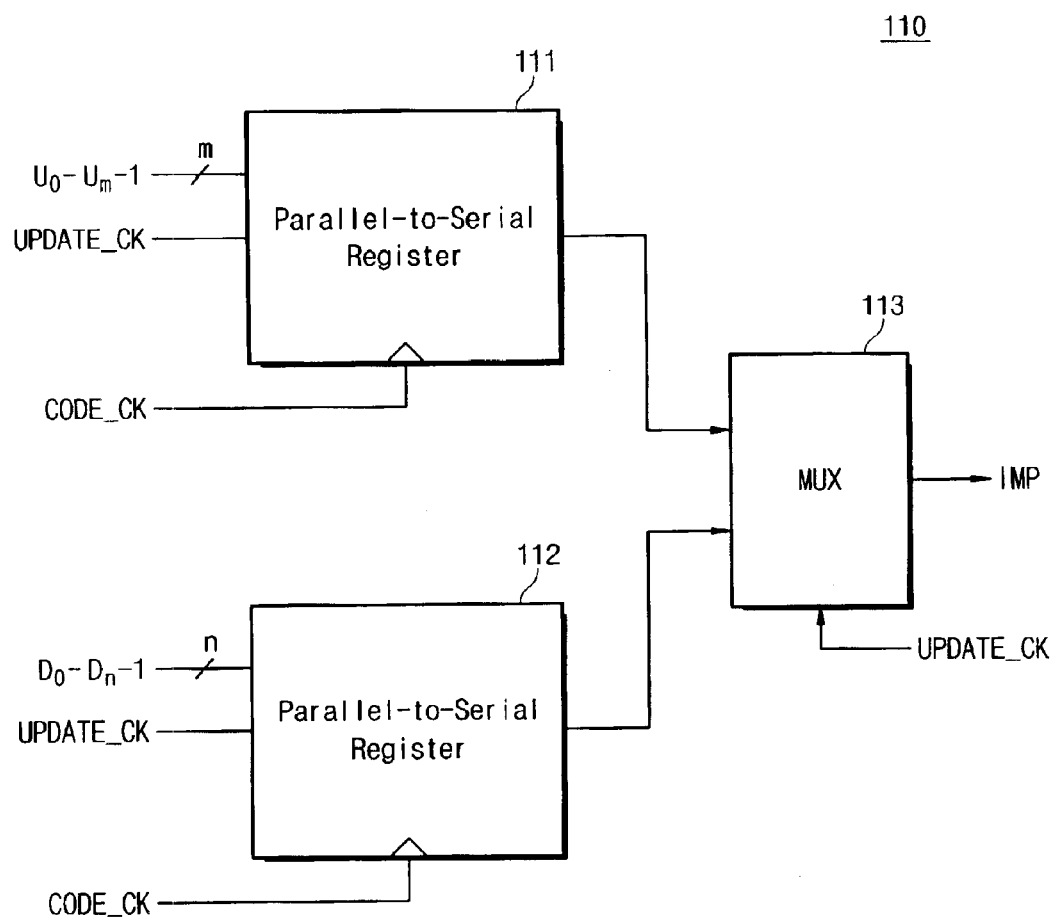
FIG. 8 is a block diagram of a parallel-to-serial converter in FIG. 3.
Figure 9:
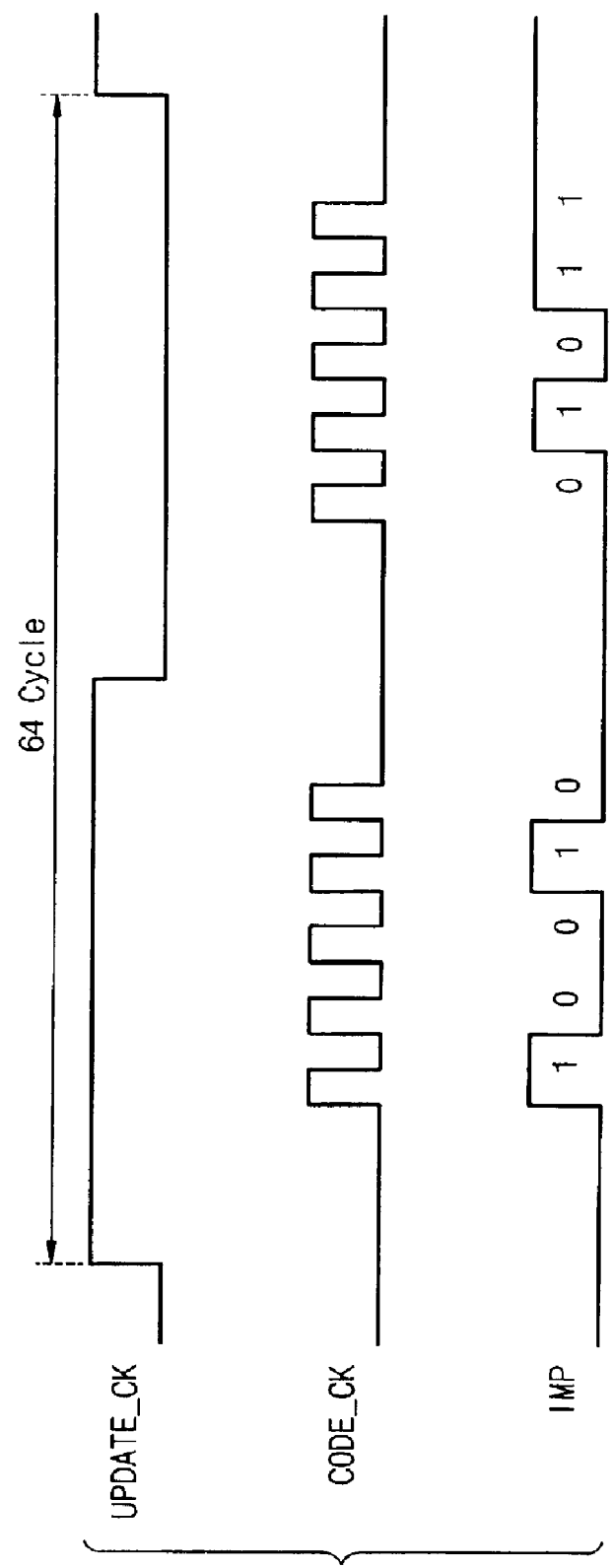
FIG. 9 is a timing diagram of signals used in a parallel-to-serial converter in FIG. 8.

FIG. 8 is a block diagram of a parallel-to-serial converter 110 in FIG. 3, and FIG. 9 is a timing diagram of signals used in the parallel-to-serial converter 110.

Referring to FIG. 8, a parallel-to-serial converter 110 comprises parallel-to-serial registers 111 and 112 and a multiplexer 113. The parallel-to-serial register 111 receives and stores data U0–Um−1 from a register 125 during a high period of a clock signal UPDATE_CK. The data U0–Um−1 has a parallel format. The parallel-to-serial register 111 sequentially outputs the stored data bits U0–Um−1 by one bit in synchronism with a clock signal CODE_CK during a low period of the clock signal UPDATE_CK. The parallel-to-serial register 112 receives and stores data D0–Dn−1 from a register 107 during the low period of the clock signal UPDATE_CK. The data D0–Dn−1 has a parallel format. The parallel-to-serial register 112 sequentially outputs the stored data bits D0–Dn−1 by one bit in synchronism with the clock signal CODE_CK during the high period of the clock signal UPDATE_CK. The multiplexer 113 operates responsive to the clock signal UPDATE_CK. For example, when the clock signal UPDATE_CK is at a high level, the multiplexer 113 selects the register 112 and provides data bits serially output from the selected register 112 to an output buffer circuit 25 in FIG. 1 through a single transmission line IMP. When the clock signal UPDATE_CK is at a low level, the multiplexer 113 selects the register 111 and provides data bits serially output from the selected register 111 to the output buffer 5 circuit 25 in FIG. 1 through the single transmission line IMP.

An output impedance control circuit 26 comprises PMOS transistors CS1–CS3, each of which supplies DC current to a corresponding node (e.g., ZQ, REFD, and DNX), and NMOS transistors DS1 and DS2, each of which discharges DC current. By the transistors CS1–CS3, DS1 and DS2, sizes of transistors P1–P3, N1 and N2 can be scaled down as compared with a device without the transistors. In addition, as understood from the above, the parallel-to-serial converter 110 serially outputs parallel data bits U0–Um−1 and D0–Dn−1 for controlling pull-up and pull-down sections 25a and 25b in the output buffer circuit 25, so that only one signal line IMP is needed between an output impedance control circuit 26 and the output buffer circuit 25 to transfer control codes U0–Um−1 and D0–Dn−1.

Figure 10:
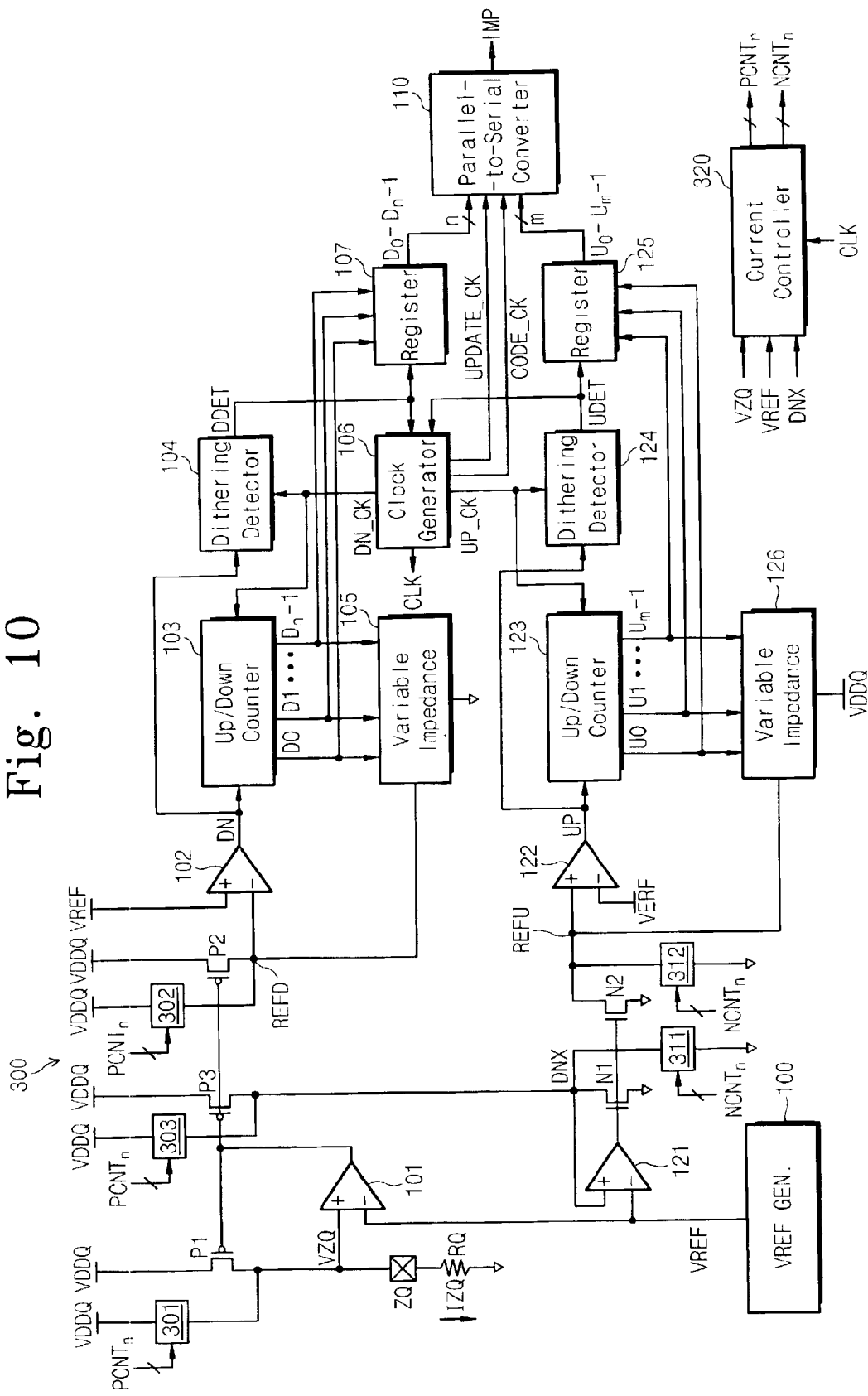
FIG. 10 shows an output impedance control circuit according to a preferred embodiment of the present invention.

FIG. 10 shows an output impedance control circuit 300 according to another preferred embodiment of the present invention. In FIG. 10, constituent elements that are substantially similar to those in FIG. 3 are marked by the same reference numerals, and a description thereof will be thus omitted.

An output impedance control circuit 26 in FIG. 3 has PMOS transistors CS1–CS3 as constant current sources and NMOS transistors DS1 and DS2 as discharge circuits. An output impedance control circuit 300 in FIG. 10 comprises current source circuits 301–303 and discharge circuits 311 and 312. The current source circuit 301 is connected between a power supply voltage VDDQ and a pad ZQ, the current source circuit 302 is connected between the power supply voltage VDDQ and a node REFD, and the current source circuit 303 is connected between the power supply voltage VDDQ and a node DNX. The discharge circuit 311 is connected between the node DNX and a ground voltage, and the discharge circuit 312 is connected between a node REFU and the ground voltage.

The current source circuits 301–303 determine the amount of current flowing to the nodes ZQ, REFD, and the DNX in response to control signals PCNTn (n=0 to i−1) from a current control circuit 320, respectively. The discharge circuits 311 and 312 determine the amount of current flowing from the nodes DNX and REFU in response to control signals NCNTn from the current control circuit 320, respectively.

Figure 11:
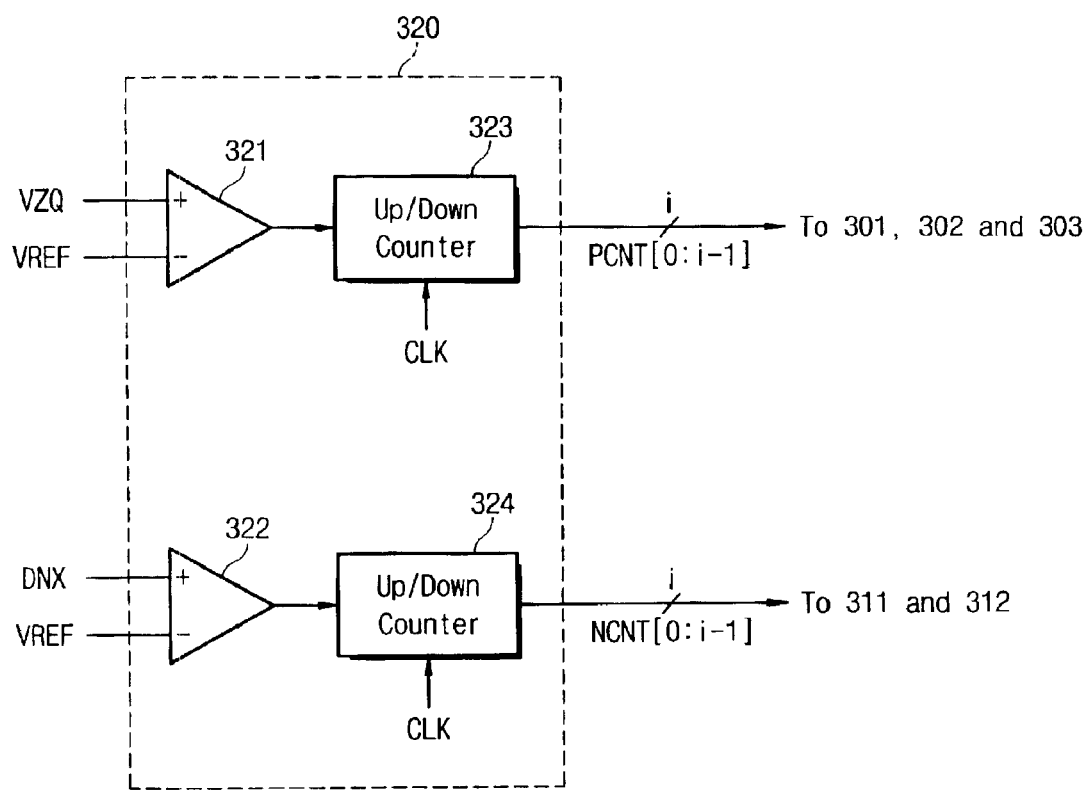
FIG. 11 shows a preferred embodiment of a current controller in FIG. 10.

FIG. 11 shows a preferred embodiment of the current controller 320 in FIG. 10. Referring to FIG. 11, the current controller 320 comprises comparators 312 and 322 and up/down counters 323 and 324. The comparator 312 compares a voltage VZQ of a node ZQ with a reference voltage VREF, and the comparator 313 compares a voltage of a node DNX with the reference voltage VREF. The counters 323 and 324 operate in response to a clock signal CLK from a clock generator 106.

When an output signal of the comparator 321 is at a low level, that is, when the voltage VZQ is lower than the reference voltage VREF, an output value PCNT[0-i−1] of the counter 323 is increased by one. When an output signal of the comparator 321 is at a high level, that is, when the voltage VZQ is higher than the reference voltage VREF, an output value PCNT[0:i−1] of the counter 323 is decreased by one. The output signals PCNT[0:i−1] are provided to the current source circuits 301–303.

When an output signal of the comparator 322 is at a low level, that is, when a voltage of the node DNX is lower than the reference voltage VREF, an output value NCNT[0-i−1] of the counter 324 is increased by one. When an output signal of the comparator 322 is at a high level, that is, when the voltage of the node DNX is higher than the reference voltage VREF, an output value NCNT[0:i−1] of the counter 324 is decreased by one. The output signals NCNT[0:i−1] are provided to the discharge circuits 311–312.

Figure 12:
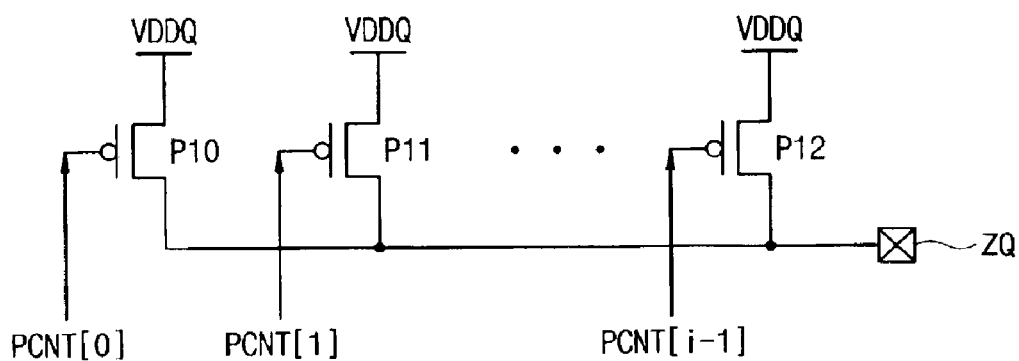
FIG. 12 shows a preferred embodiment of one of current source circuits in FIG. 10.

FIG. 12 shows a preferred embodiment of the current source circuit 301 in FIG. 10. The current source circuit 301 connected to a pad ZQ, however, circuits 302 and 303 are substantially similar to the current source circuit 301 illustrated in FIG. 12. A description thereof will be thus omitted for brevity's sake.

Referring to FIG. 12, the current source circuit 301 comprises a plurality of PMOS transistors P10–P12 that are controlled by corresponding control signals PCNT0–PCNT (i−1) from a current controller 320, respectively. The PMOS transistors P10–P12 are connected in parallel between a power supply voltage VDDQ and the node ZQ. To adjust the amount of current flowing to the ZQ pad so as to correspond to a count value PCNT[0:i−1] of a counter 323, the PMOS transistors P10–P12 vary in size from each other according to a binary-weighted count value PCNT[0:i-1]. For example, a size of the PMOS transistor P11 doubles that of the PMOS transistor P10.

Figure 13:
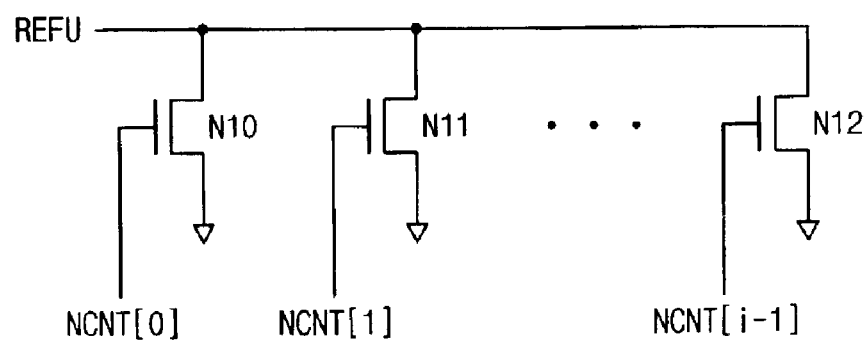
FIG. 13 shows a preferred embodiment of a discharge circuit of FIG. 10.

FIG. 13 shows a preferred embodiment of the discharge circuit 312 in FIG. 10. In FIG. 10 the discharge circuit 312 connected to a node REFU. Circuit 311 is similar to the discharge circuit 312 as illustrated in FIG. 13, and a description thereof will be thus omitted for brevity's sake.

Referring to FIG. 13, the discharge circuit 312 comprises a plurality of NMOS transistors N10–N12 that are controlled by corresponding control signals NCNT0–NCNT(i–1) from a current controller 320, respectively. The NMOS transistors N10–N12 are connected in parallel between the node REFU and a ground voltage. To adjust the amount of current flowing from the node REFU so as to correspond to a count value NCNT[0:i–1] of a counter 324, the NMOS transistors N10–N12 vary in size from each other according to a binary-weighted count value NCNT[0:i–1]. For example, a size of the NMOS transistor N11 doubles that of the NMOS transistor N10.

Figure 14:
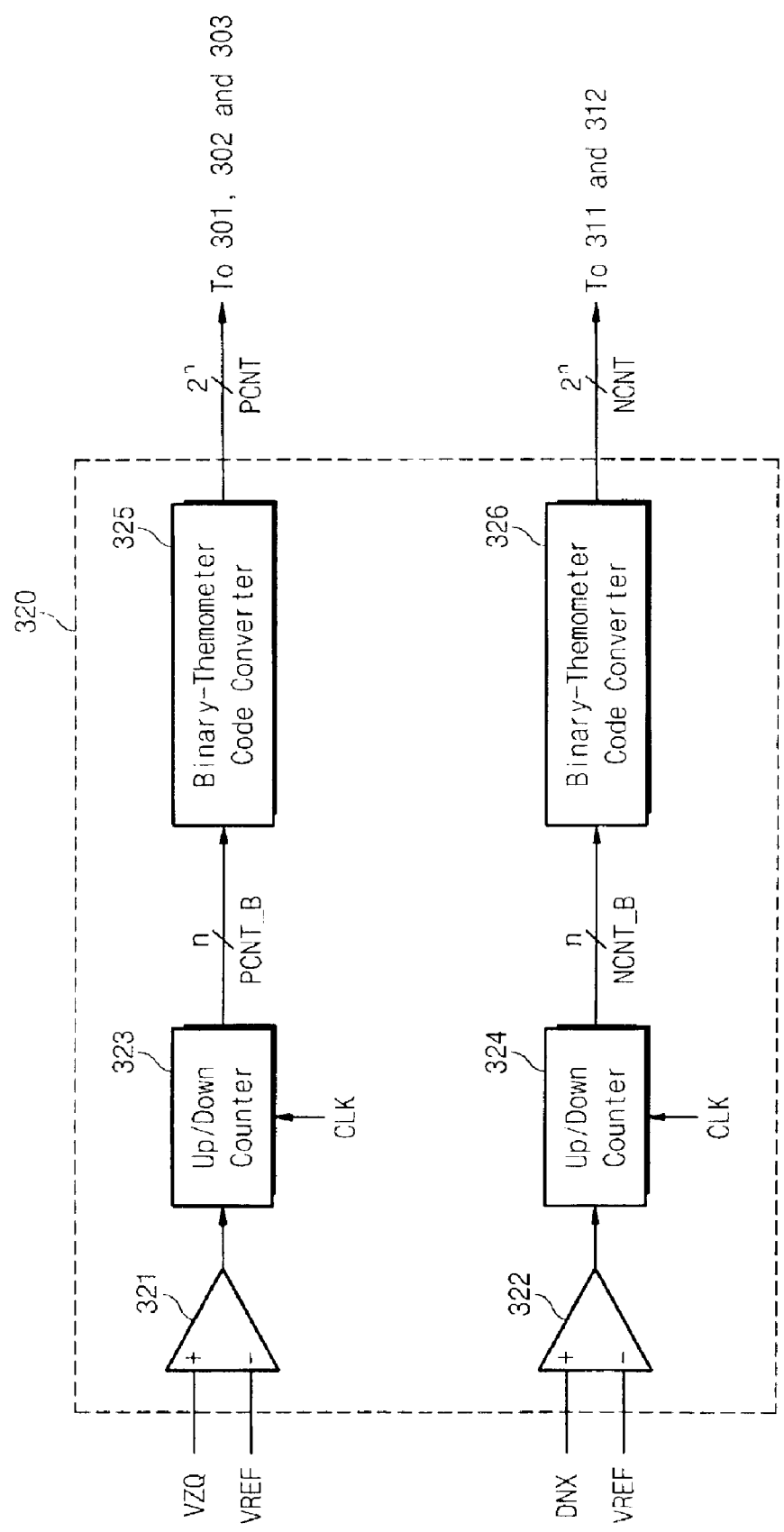
FIG. 14 shows another embodiment of a current controller in FIG. 10.

FIG. 14 shows another embodiment of the current controller 320 in FIG. 10. Referring to FIG. 14, the current controller 320 comprises comparators 321 and 322, up/down counters 323 and 324, and binary-thermometer code converters 325 and 326. The comparator 321 compares a voltage VZQ of a pad ZQ with a reference voltage VREF, and the up/down counter 323 performs a count-up/down operation in response to an output signal of the comparator 321. The comparator 322 compares a voltage of a node DNX with the reference voltage VREF, and the up/down counter 324 performs a count-up/down operation in response to an output signal of the comparator 322.

For example, when an output signal of the comparator 321 is at a low level, that is, when the voltage VZQ is lower than the reference voltage VREF, an output value PCNT_Bn (n=0 to (i–1)) of the counter 323 is increased by one. When an output signal of the comparator 321 is at a high level, that is, when the voltage VZQ is higher than the reference voltage VREF, an output value PCNT_Bn of the counter 323 is decreased by one. The code converter 325 converts a binary count value PCNT_Bn of the counter 323 into a thermometer code PCNT[$0:2^i-1$].

When an output signal of the comparator 322 is at a low level, that is, when the voltage of the node DNX is lower than the reference voltage VREF, an output value NCNT_Bn of the counter 324 is increased by one. When an output signal of the comparator 322 is at a high level, that is, when the voltage of the node DNX is higher than the reference voltage VREF, an output value NCNT_Bn of the counter 324 is decreased by one. The code converter 326 converts a binary count value NCNT_Bn of the counter 324 into a thermometer code NCNT[$0:2^i-1$].

Figure 15:
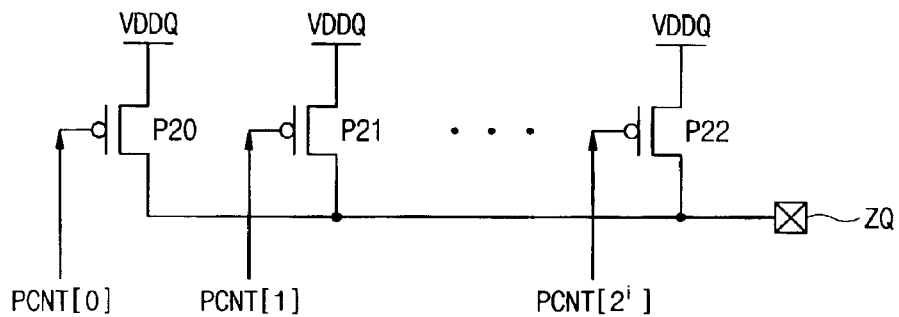
FIG. 15 shows a current source circuit in FIG. 10 which is controlled by a thermometer code from a current controller.

FIG. 15 shows the current source circuit 301 in FIG. 10 that is controlled by thermometer code PCNT[$0:2i-1$] from a current controller 320. Referring to FIG. 15, the current source circuit 301 comprises a plurality of PMOS transistors P20–P22 that are connected in parallel between a power supply voltage VDDQ and a pad ZQ. The transistors P20–P22 are controlled by corresponding control signals PCNT[$0:2^i-1$] from a binary-thermometer code converter 325 in FIG. 14, respectively. The transistors P20–P22 have the same size. The reason is because an output of the converter 325 is a thermometer code and the number of turned-on transistors is determined by the thermometer code.

Again referring to FIGS. 10 to 12, the driving capacity of each of transistors P1–P3 is more than that of current source circuits 301–303. The reason is because the amount of current supplied by the current source circuits 301–303 is dropped (or a dithering phenomenon arises) when a voltage VZQ of a pad ZQ reaches a reference voltage VREF (VDDQ/2) and an output signal of each of comparators 321 and 322 swings between a high level and a low level. If the driving capacity of each PMOS transistor is more than that of each current source circuit, the amount of current flowing via each transistor is more than that flowing via each current source circuit, so that an operation amplifier 101 for controlling the PMOS transistors P1–P3 is substantially unaffected by a current variation of the transistors P1–P3.

Figure 16A:
FIGS. 16A to 16C show convergence of a voltage of a ZQ pad into a reference voltage according to a driving capacity of a current source circuit 301 and a PMOS transistor P1, according to an embodiment of the present invention.
Figure 16B:
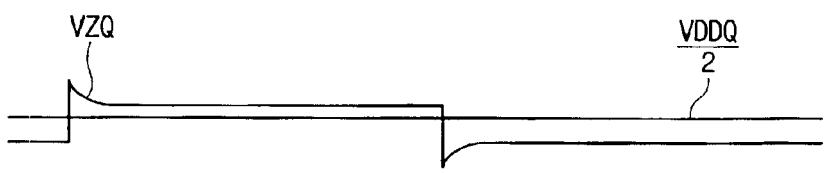
Figure 16C:

FIG. 16 shows convergence of a voltage VZQ of a pad ZQ into a reference voltage VREF according to a driving capacity of a current source circuit 301 and a PMOS transistor P1. Referring to FIG. 16A, when a driving capacity of a PMOS transistor PI is more than that of a current source circuit 301, a voltage VZQ of a pad ZQ converges into a reference voltage VREF (VDDQ/2). When a driving capacity of the PMOS transistor P1 is more than that of the current source circuit 301, a voltage VZQ of a pad ZQ swings on the basis of the reference voltage VREF (VDDQ/2), as illustrated in FIG. 16B. Accordingly, a size of the PMOS transistor PI becomes sufficiently large so that a driving capacity of the transistor P1 becomes sufficiently larger than that of the current source circuit 301.

As described above, the output impedance control circuit 300 adjusts a driving capacity of current source and discharge circuits 301–303, 311, and 312 according to a voltage difference between a voltage VZQ and a reference voltage VREF. Therefore, as compared to when current source and discharge circuits are not used, the sizes of transistors P1–P3 and N–N2 can be scaled down. In addition, a resistance value of an external resistor RQ is not limited by a driving capacity of the transistor PI. The reason is because the amount of current flowing to the pad ZQ is adjusted by the current source circuit 301.

It would be obvious to one skilled in the art that comparators can be realized using an operational amplifier.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A semiconductor device comprising:
an output buffer circuit comprising a pull-up section having a plurality of pull-up transistors and a pull-down section having a plurality of pull-down transistors;
a pad connected to an external resistor; and
an output impedance control circuit, connected to the pad and the output buffer circuit, for controlling an impedance of the output buffer circuit according to an impedance of the external resistor,
wherein the output impedance control circuit comprises:
a first transistor connected to the pad;
a first current source circuit for supplying DC current to the pad;
a first level controller, connected to the pad, for controlling a gate voltage of the first transistor such that the pad is established at a predetermined voltage;
a second transistor, connected to a first internal node, controlled by the first level controller;
a first variable impedance circuit connected to the first internal node;

a second current source circuit for supplying DC current to the first internal node;

a first controller, responsive to a voltage variation of the first internal node, for generating a first control code for controlling the first variable impedance circuit so that a voltage of the first internal node is established at the predetermined voltage; and a first conversion circuit for receiving the first control code and for converting the first control code into a first string of data bits, wherein the first string of data bits are transferred in series to the output buffer circuit via a single transmission line.

2. The semiconductor device according to claim 1, wherein the output impedance control circuit further comprises:

a third transistor connected to a second internal node and controlled by the first level controller;

a third current source circuit for supplying DC current to the second internal node;

a fourth transistor connected to the second internal node;

a second level controller, connected to the second internal node, for controlling a gate voltage of the fourth transistor such that the second internal node is established at the predetermined voltage;

a first discharge circuit for discharging DC current from the second internal node;

a fifth transistor connected to a third internal node and controlled by the second level controller;

a second discharge circuit for discharging DC current from the third internal node;

a second variable impedance circuit connected to the third internal node;

a second controller, responsive to a voltage variation of the third internal node, for generating a second control code for controlling the second variable impedance circuit so that a voltage of the third internal node is established at the predetermined voltage;

a second conversion circuit for receiving the second control code and converting the second control code into a second string of data bits; and a selector for selecting the first and second conversion circuits in turn, wherein, one of the first and the second string of data bits from a selected conversion circuit are transferred in series to the output buffer circuit via the single transmission line, so that transistors of each of the pull-up and pull-down sections are selectively turned-on by the one of first and second string of data bits from the selected conversion circuit.

3. The semiconductor device according to claim 2, wherein the predetermined voltage is half a power supply voltage that is an operating voltage of the output buffer circuit.

4. The semiconductor device according to claim 3, wherein each of the first, second, and third current source circuits comprise a PMOS transistor whose gate is grounded.

5. The semiconductor device according to claim 3, wherein each of the first and second discharge circuits comprise an NMOS transistor whose gate is connected to the power supply voltage.

6. The semiconductor device according to claim 3, wherein the output impedance control circuit further comprises a clock generator for generating a first, second, third, and fourth clock signals, the first, second, and third clock signals having the same period and the fourth clock signal having a period shorter than that of the third clock signal.

7. The semiconductor device according to claim 6, wherein the first controller comprises:

a comparator for comparing a voltage of the second internal node with a reference voltage; and an up/down counter for generating the first control code in response to an output of the comparator.

8. The semiconductor device according to claim 7, wherein the first conversion circuit comprises:

a dithering detector, responsive to the first clock signal and an output of the comparator, for detecting whether a voltage of the second internal node swings within a predetermined voltage range;

a register for storing the first control code when a voltage of the second internal node swings within the predetermined voltage range; and a parallel-to-serial converter for converting the first control code into the first string of data bits in response to the third and fourth clock signals, wherein when a voltage of the second internal node swings within the predetermined voltage range the clock generator makes a period of the first clock signal become two times longer than that of the third clock signal.

9. The semiconductor device according to claim 6, wherein the second controller comprises:

a comparator for comparing a voltage of the third internal node with a reference voltage; and an up/down counter for generating the second control code in response to an output of the comparator.

10. The semiconductor device according to claim 9, wherein the second conversion circuit comprises:

a dithering detector, responsive to the second clock signal and an output of the comparator, for detecting whether a voltage of the third internal node swings within a predetermined voltage range;

a register for storing the second control code when a voltage of the third internal node swings within the predetermined voltage range; and a parallel-to-serial converter for converting the second control code into the second string of data bits in response to the third and fourth clock signals, wherein when a voltage of the second internal node swings within the predetermined voltage range the clock generator makes a period of the second clock signal become two times longer than that of the third clock signal.

11. The semiconductor device according to claim 6, wherein the selector selects either one of the first and second conversion circuits in response to a first logic interval of the third clock signal and the other thereof in response to a second logic interval of the third clock signal.

12. The semiconductor device according to claim 3, wherein a driving capacity of each of the first, second, and third current source circuits is adjusted by a current controller that compares voltages of the pad and internal node with a reference voltage and generates first control signals and second control signals.

13. The semiconductor device according to claim 12, wherein a driving capacity of each of the first and second discharge circuits is adjusted by the current controller.

14. The semiconductor device according to claim 13, wherein each of the first, second, and third current source circuits comprises a plurality of PMOS transistors controlled by the first control signals, and each of the first and second discharge circuits comprises a plurality of NMOS transistors controlled by the second control signals.

15. The semiconductor device according to claim 14, wherein the first control signals and the second control signals are generated so as to have a segmented thermometer code format.

16. The semiconductor device according to claim 3, wherein the first variable impedance circuit comprises:
   a binary-thermometer code converter for converting the first control code into a separated thermometer code; and
   a plurality of pull-down transistors connected in parallel to the first internal node and controlled by the separated thermometer code.

17. The semiconductor device according to claim 3, wherein the second variable impedance circuit comprises:
   a binary-thermometer code converter for converting the second control code into a separated thermometer code; and
   a plurality of pull-up transistors connected in parallel to the third internal node and controlled by the separated thermometer code.

18. A semiconductor memory device comprising:
   an output buffer circuit;
   a pad connected to the output buffer circuit; and
   an output impedance control circuit connected to the pad,
   wherein the output buffer circuit outputs internally read-out data through the pad, and the output impedance control circuit detects an impedance of an external resistor connected to the pad and automatically controls an impedance of the output buffer circuit according to a detection result.

19. The semiconductor device of claim 18, wherein the output impedance control circuit internally generates pull-up and pull-down control codes having a parallel format and outputs the pull-up and pull-down control codes having a serial format to the output buffer circuit.

20. The semiconductor device of claim 18, wherein the only one signal line is used for transmitting pull-up and pull-down control codes to the output buffer circuit.

* * * * *